(12) United States Patent
Sinha et al.

(10) Patent No.: US 12,341,110 B2
(45) Date of Patent: Jun. 24, 2025

(54) METHODS AND APPARATUS FOR USING STRUCTURAL ELEMENTS TO IMPROVE DROP/SHOCK RESILIENCE IN SEMICONDUCTOR DEVICES

(71) Applicant: Micron Technology, Inc., Boise, ID (US)

(72) Inventors: Koustav Sinha, Boise, ID (US); Quang Nguyen, Boise, ID (US); Christopher Glancey, Boise, ID (US); Shams U. Arifeen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 353 days.

(21) Appl. No.: 17/591,519

(22) Filed: Feb. 2, 2022

(65) Prior Publication Data

US 2023/0061955 A1 Mar. 2, 2023

Related U.S. Application Data

(60) Provisional application No. 63/238,051, filed on Aug. 27, 2021.

(51) Int. Cl.
*H01L 23/00* (2006.01)
*H01L 23/498* (2006.01)

(52) U.S. Cl.
CPC ...... *H01L 23/562* (2013.01); *H01L 23/49838* (2013.01)

(58) Field of Classification Search
None
See application file for complete search history.

(56) References Cited

U.S. PATENT DOCUMENTS

| | | | | |
|---|---|---|---|---|
| 6,053,394 | A * | 4/2000 | Dockerty | H05K 3/3436 228/226 |
| 2005/0133905 | A1 * | 6/2005 | Zhao | H01L 23/36 257/676 |
| 2015/0214192 | A1 * | 7/2015 | Lin | H01L 23/49816 257/737 |

* cited by examiner

*Primary Examiner* — Bo B Jang
(74) *Attorney, Agent, or Firm* — Perkins Coie LLP

(57) ABSTRACT

A semiconductor package assembly includes a first mounting surface of a package substrate that faces a second mounting surface of a printed circuit board. A first structural element bond pad is mounted to the first mounting surface. A second structural element bond pad is mounted to the second mounting surface, and the first and second structural element bond pads are aligned with each other. A structural element is interconnected with a first solder joint to the first structural element bond pad and interconnected with a second solder joint to the second structural element bond pad. The structural element extends between the first and second structural element bond pads to absorb mechanical shock when a compressive force pushes one of the first and second mounting surfaces toward the other.

14 Claims, 7 Drawing Sheets

METHODS AND APPARATUS FOR USING STRUCTURAL ELEMENTS TO IMPROVE DROP/SHOCK RESILIENCE IN SEMICONDUCTOR DEVICES

CROSS-REFERENCE TO RELATED APPLICATION(S)

The present application claims priority to U.S. Provisional Patent Application No. 63/238,051, filed Aug. 27, 2021, the disclosure of which is incorporated herein by reference in its entirety.

TECHNICAL FIELD

The present technology is directed to semiconductor device packaging. More particularly, some embodiments of the present technology relate to techniques for improving the resilience of semiconductor devices.

BACKGROUND

Semiconductor dies, including memory chips, microprocessor chips, logic chips and imager chips, are typically assembled by mounting a plurality of semiconductor dies, individually or in die stacks, on a substrate in a grid pattern. The assemblies can be used in mobile devices, computing, and/or automotive products. If the device or product is dropped or experiences a sudden impact, the drop and/or shock loading can initiate a crack in structures, especially at the corner and edge solder joints. If the crack length reaches a critical value, an open circuit can result and the component can eventually fail to operate.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

DETAILED DESCRIPTION

Figure 1:
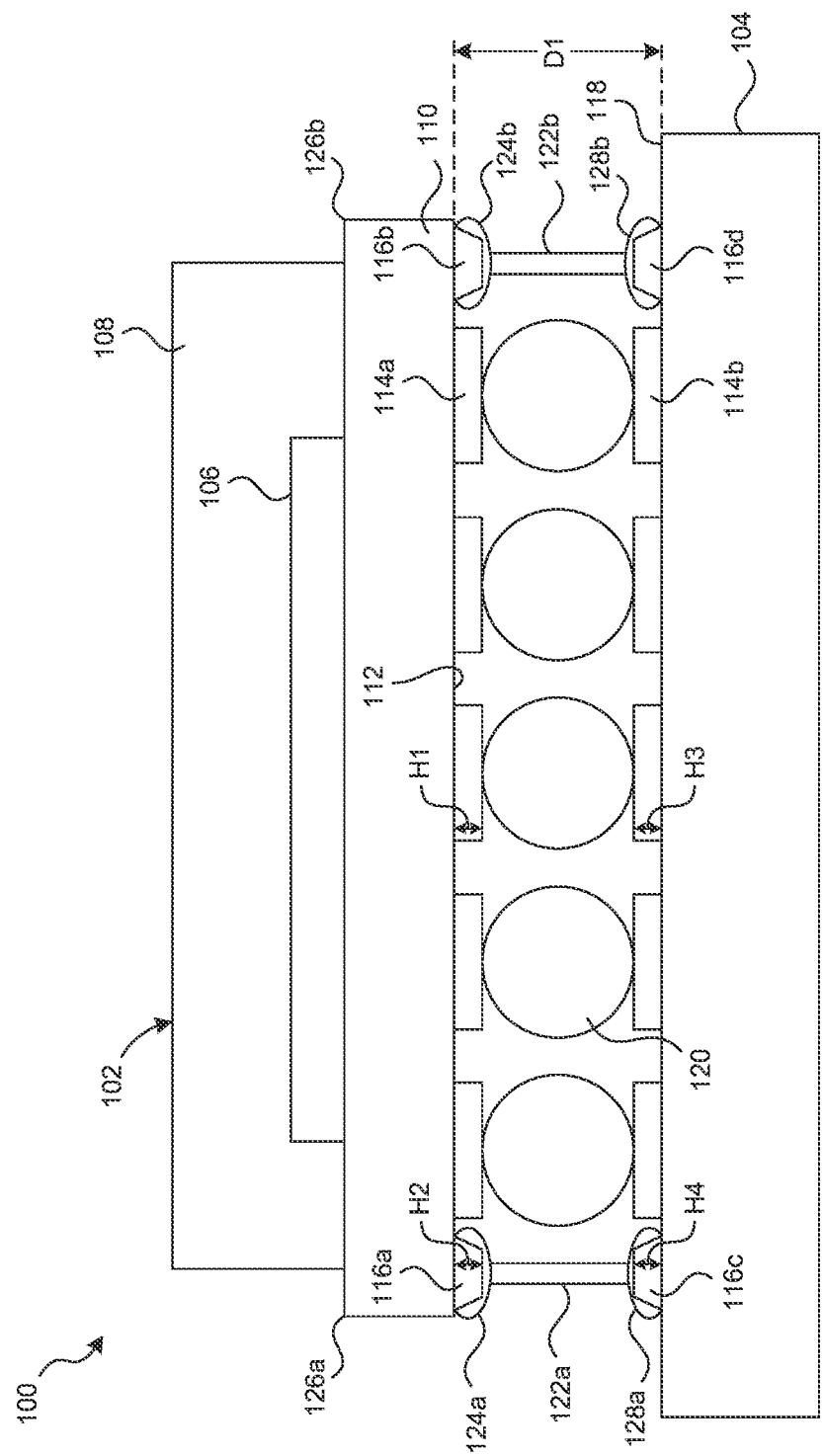
FIG. 1 is a cross-sectional view of a semiconductor device assembly, that has a semiconductor device connected to a printed circuit board with structural elements interconnected therebetween in accordance with the present technology.

Specific details of several embodiments of semiconductor devices are described below, including method and apparatus for reducing interface cracking that can occur at the solder ball connections between semiconductor devices and a printed circuit board (PCB). In some embodiments, the interface cracking can be induced by "drop and/or shock" when the device or assembly is dropped or otherwise experiences an impact. The drop and shock are driven by tensile or normal stress in the solder balls. The incorporation of one or more structural elements of the present technology can provide the technical advantage of protecting at least the areas that are proximate corners and edges of the semiconductor devices, especially for critically functional pins. The structural elements are stiff and absorb at least some of the environmental shock (e.g., mechanical, temperature, etc.) and relieve the stress from the solder ball joints.

Advantages and benefits of the use of structural elements include the low cost of implementing the feature(s), which are also easy to integrate into present process flows. By implementing one or more structural element as discussed below, solder joint reliability and yield are increased, while infant mortality of the semiconductor package is decreased. Incorporating the structural element(s) can also result in a robust package structure for high thermal stress applications such as automotive and server applications.

A further advantage of some embodiments is the ability to implement differently shaped structural elements to enhance protection. Multiple structural elements can be grouped or clustered together to provide more robust protection, and in some cases, multiple structure elements can share a single bond pad. Structural elements can be made of one or more metals, such as a single copper wire, multiple copper wires, or a structure (copper, aluminum, etc.) that is cylindrical, a wall extending along an outer edge of the mounting surface, and/or a wall extending into or positioned within the ball grid array. A single structural element can be used, or multiple structural elements can be used to provide the desired shock protection.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1-6. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below", "top", and "bottom" can refer to relative directions or positions of features in the semiconductor devices in view of the orientation shown in the Figures. For example, "upper", "uppermost", or "top" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1 illustrates an overview of an embodiment of the present technology, while FIGS. 2-5 illustrate further details of various alternative embodiments of the present technology. Like reference numbers relate to similar components and features in FIGS. 1-4. The present technology addresses the technical problem of stress on solder joints due to mechanical impact and/or temperature fluctuations, which can lead to crack initiation at corner and/or edge joints, as well as other locations interior to the semiconductor package interface. One or more structural elements included in the interface of the ball grid array between two surfaces can prevent the crack initiation due to sudden drop and shock loading.

FIG. 1 is a cross-sectional view of a semiconductor package 100 including a semiconductor device 102 mounted to a printed circuit board (PCB) 104 in accordance with embodiments of the present technology. The device 102 includes a semiconductor die 106 encased in molding material 108 and a substrate 110 (e.g., an organic printed circuit board, package-level substrate, etc.) with a mounting surface 112 that has an array of ball grid array (BGA) bond pads 114 applied/mounted thereon (indicated collectively as 114a). The molding material 108 can be a resin, epoxy resin, silicone-based material, polyimide, or any other material suitable for encapsulating and protecting the components from contaminants and/or physical damage. Additional structural element bond pads 116a, 116b are applied/mounted on the mounting surface 112 of the substrate 110. Although a single die 106 is shown within the device 102, in other embodiments the device 102 can include multiple dies 106 in one or more different die stacks, and the multiple dies 106 can be stacked in vertical alignment, shingled, etc.

The PCB 104 has a mounting surface 118 that is positioned to face the mounting surface 112 of the substrate 110. The mounting surface 118 of the PCB 104 has an array of BGA bond pads 114 (indicated collectively as 114b) and structural element bond pads 116c, 116d mounted thereon. The arrays of BGA bond pads 114a and 114b of the substrate 110 and PCB 104 are aligned with each other, and the aligned individual bond pads 114 are electrically interconnected with solder balls 120 of a BGA. The structural element bond pads 116 are also aligned between the substrate 110 and the PCB 104, such that structural element bond pads 116a and 116c are aligned, and structural element bond pads 116b and 116d are aligned. In some embodiments, the mounting surface 112 of the substrate 110 is the bottom surface of the substrate 110, and the mounting surface 118 of the PCB 104 is the top surface of the PCB 104.

Structural elements 122, which may also be referred to as buffer elements and/or shock absorbers, are interconnected with and extend between aligned ones of the structural element bond pads 116 on the mounting surfaces 112, 118. Therefore, each structural element 122a, 122b is joined to a first mounting surface (e.g., the mounting surface 112) with a first solder joint 124a, 124b, and is joined to a second mounting surface (e.g., the mounting surface 118) with a second solder joint 128a, 128b. Although structural elements 122 are shown located proximate to two corners 126a, 126b of the package 100, there may be a one or more structural elements 122 located in one, three, or four corners 126, along an edge, or interior between the solder balls 120 of the BGA. As discussed further below in FIGS. 2A-2C, the structural elements 122 can be located or positioned in three or four corners 126 of the package 100, and there can be more than one structural element 122 (e.g., two, three, four, or more than four structural elements 122) proximate a single corner 126. Also, as discussed further below in FIGS. 2A-2C and 3A-3E, the structural elements 122 can be cylindrical, elongated, and/or columnar in shape, have a uniform or non-uniform shape, and can in some cases extend in between or be separately located between the BGA bond pads 114 and/or solder balls 120.

The structural elements 122 can be formed of a stiff material such as copper and/or aluminum, but are not so limited. In some embodiments a copper wire can be used. Other materials can be used as long as the material can be adhered securely to the mounting surfaces 112, 118 with solder and/or other adhesive. The dimensions, such as cross-sectional size and shape of the structural elements 122 can be determined at least in part on the amount of space available on the substrate 110 and the PCB 104. The dimensions can also be determined at least in part on the level or amount of shock one or more of the structural elements 122 are to absorb. The structural elements 122 can be varying sizes and shapes across the package 100. For example, in some embodiments a cross-sectional width of the solder balls 120 can be approximately 200-300 microns, while a cross-sectional width of a structural element 122, such as a copper wire, can be 40-80 microns. Other sizes are contemplated, and other shapes of structural elements 122 can result in differently-sized structures.

In some embodiments, the structural elements 122 can be adhered to the mounting surfaces 112, 118 with an adhesive rather than solder. As the structural element 122 is not electrically connected (e.g., electrically isolated), the adhesive is used to mechanically interconnect the device 102 and the PCB 104. In other embodiments, the structural elements 122 can provide an electrical interconnect by conveying signal and/or providing power or ground connections between the PCB 104 and the substrate 110.

A distance D1 between the first and second mounting surfaces 112, 118 is kept constant to keep the first and second mounting surfaces 112, 118 parallel with each other and to prevent warpage of the package 100. As shown in FIG. 1, a height H1 of the bond pads in the array of bond pads 114a and a height H2 of the structural element bond pads 116a, 116b on the mounting surface 112 of the substrate 110 are the same, and a height H3 of the bond pads in the array of BGA bond pads 114b and a height H4 of the structural elements bond pads 116c, 116d on the mounting surface 118 of the PCB 104 are the same. In this example, the height (not indicated) of the structural elements 122 and the height (not indicated) of the solder balls 120 can be the same. However, the heights of the bond pads 114, 116 can be different from each other and the heights of the solder balls 120 and structural elements 122 can be different from each other as long as the parallel relationship between the substrate 110 and the mounting surfaces 112, 118 is maintained.

The structural elements 122 can absorb large amounts of shock, such as but not limited to, at the corners 126 (e.g., corner edge areas) and/or side edges of the package 100. Therefore, the structural elements 122 can relieve the solder joints in the corners 126, or other areas where the structural elements 122 are located by carrying the load of stress in a direction normal to the mounting surfaces 112, 118. Normal stresses can, in some cases, be compressive forces that push the substrate 110 and PCB 104 together, and/or retention forces in the z direction. This relief of the impact of shock can delay solder joint failure and elongate the life of the package 100. In some embodiments, a temperature cycling reliability improvement may be realized due to the structural elements 122 carrying some of the thermal mismatch load, thus reducing the load with the solder balls 120. In other embodiments, thermal mitigation (e.g., reduced temperatures in the package 100) may be realized as the structural elements 122 add thermal conduction paths between the substrate 110 and the PCB 104. Different geometries of structural elements 122 can be used to address different issues. In some embodiments, a larger or sheet wall geometry, as shown below in FIGS. 3A-3E may provide a greater benefit to mitigate the negative effects of temperature cycling.

Figure 2A:
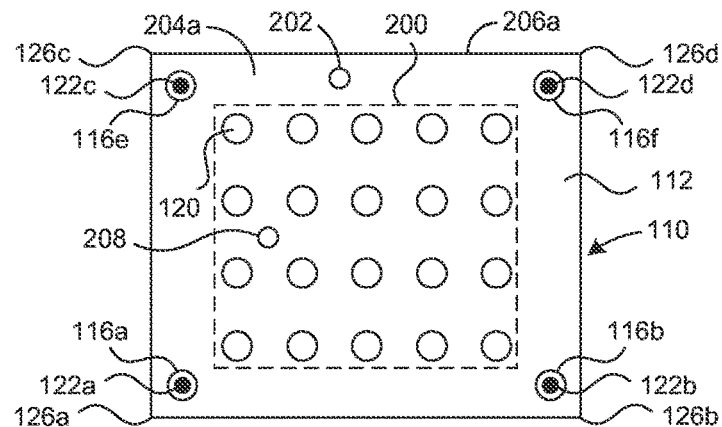
FIGS. 2A-2C are top-down views of structural elements mounted to a bottom surface of a substrate in accordance with the present technology.
Figure 2B:
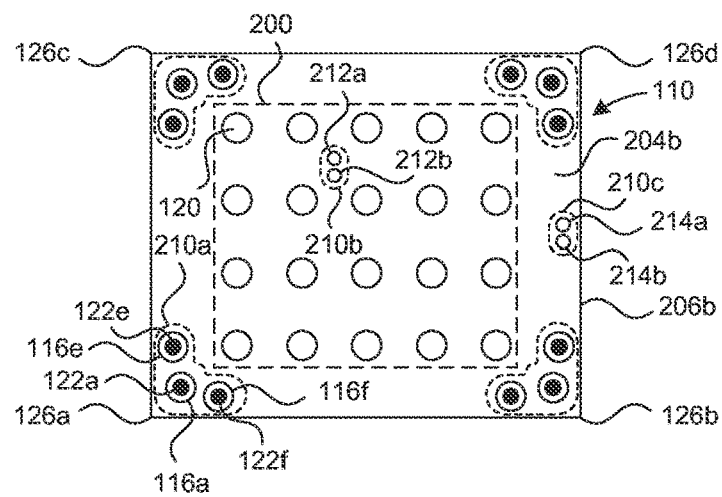
Figure 2C:
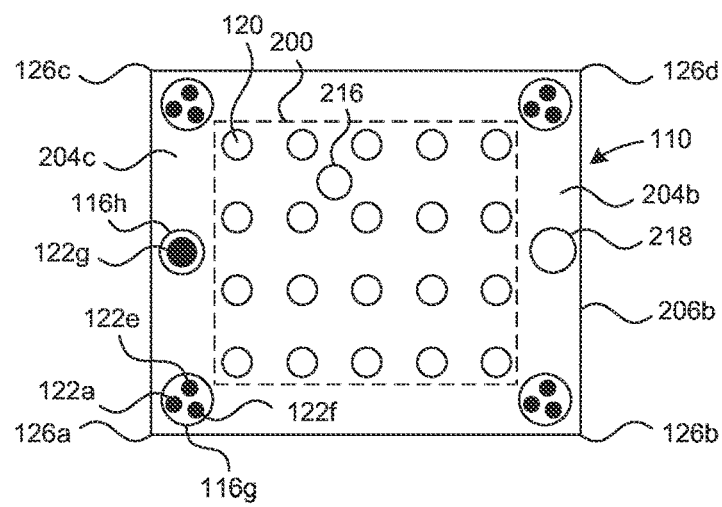

FIGS. 2A-2C are top-down views of structural elements 122 interconnected with corresponding structural element bond pads 116 mounted to the mounting surface 112 of the substrate 110 in accordance with the present technology. The structural elements 122 can be mounted to a correspondingly shaped and sized structural element bond pad 116 on the substrate 110 and, when assembled as shown in FIG. 1, to a correspondingly shaped and sized structural element bond pad 116 on the PCB 104 (not shown).

Referring to FIG. 2A, the solder balls 120 of the BGA are shown in an interior portion of the substrate 110. A perimeter 200 of the BGA is shown in dotted lines surrounding the BGA. The corners 126a, b, c, d of the substrate 110 are indicated, and the structural elements 122 are positioned outside the perimeter 200 and proximate the corners 126. In other embodiments, the cross-sectional size of the structural elements 122 can be larger than the corresponding structural element bond pads 116.

Although each of the corners 126 is shown with an associated structural element 122, there may be less than four structural elements 122 included, such as a single structural element 122, or two or three structural elements 122. In other embodiments, one or more of the structural elements 122 can be located or positioned in other areas outside the perimeter 200 on the substrate 110, such as indicated by circle 202 that is along a side 204a of the substrate 110 between the perimeter 200 and an outer edge 206a of the substrate 110. In some embodiments, one or more of the structural elements 122 can be located or positioned in between the solder balls 120 of the BGA, such as indicated by circle 208 that is interior of the perimeter 200. In further embodiments, one or more of the structural elements 122 and associated bond pads 116 can be located at least partially inside the perimeter 200.

FIG. 2B shows more than one structural element 122 positioned in a cluster 210 (indicated with dotted lines) outside the perimeter 200 and proximate the corners 126. Each of the structural elements 122 has a corresponding structural element bond pad 116. As shown, each of the corners 126 has three structural elements 122 mounted to three corresponding structural element bond pads 116. The cluster 210a with three structural elements 122a, e, f is shown proximate the corner 126a and outside the perimeter 200. (Not all of the structural elements 122, structural element bond pads 116, and clusters 210 are indicated separately.) In other embodiments, one or more of the corners 126 can have less than three structural elements 122 (e.g., one or two structural elements 122), and one or more of the corners 126 can have more than three structural elements 122 (e.g., four, five, or more structural elements 122). A cluster 210b of two or more structural elements 122 (indicated by circles 212a, b) can be positioned within the perimeter 200. In another case, a cluster 210c of two or more structural elements 122 (indicated by circles 214a, b) can be positioned along a side 204b of the substrate 110 between the perimeter 200 and the outer edge 206b of the substrate 110.

FIG. 2C shows multiple structural elements 122 positioned outside the perimeter 200 and proximate the corners 126. The multiple structural elements 122 can share one structural element bond pad 116. In some cases, the structural element bond pad 116 that accepts multiple structural elements 122 can be larger than the structural element bond pad 116 that accepts a single structural element 122, such as those shown in FIGS. 2A and 2B. As shown in FIG. 2C, there are three structural elements 122 in each of the corners 126, although more or less structural elements 122 can be used and each corner 126 can have a different number of structural elements 122 or zero structural elements 122. For example, the structural elements 122a, e, f are interconnected with the structural element bond pad 116g that can be larger than the structural element bond pad 116a of FIGS. 2A and 2B.

As discussed previously and depending upon the space available, multiple structural elements 122 (not indicated) can share a single bond pad (indicated by circle 216) that is located interior of the perimeter 200, and/or between the perimeter 200 and the outer edge 206 of the substrate 110, such as along one or more of the sides 204 of the substrate 110 (as indicated by circle 218). In still further embodiments, a larger single structural element 122 can be positioned on the larger structural element bond pad 116h, as shown in FIG. 2C located outside the perimeter 200 along the side 204c of the substrate 110.

In some embodiments, the multiple structural elements 122 are fused or otherwise joined/adhered together, while in other embodiments, the multiple structural elements 122 are separate from each other. The two or more structural elements 122 joined to the same structural element bond pad 116 may or may not be encapsulated together.

FIGS. 3A-3E are top-down views of elongated structural elements 122 mounted to the mounting surface 112 of the substrate 110 in accordance with the present technology. The structural element 122 is mounted to a correspondingly shaped and sized structural element bond pad 116 on the substrate 110 and, when assembled as shown in FIG. 1, to a correspondingly shaped and sized structural element bond pad 116 on the PCB 104 (not shown). The structural element bond pads 116 can be metal, such as copper, but are not so limited. As discussed below, the structural elements 122 can form walls or partial walls that extend between the structural element bond pads 116 on the substrate 110 and the PCB 104.

Figure 3A:
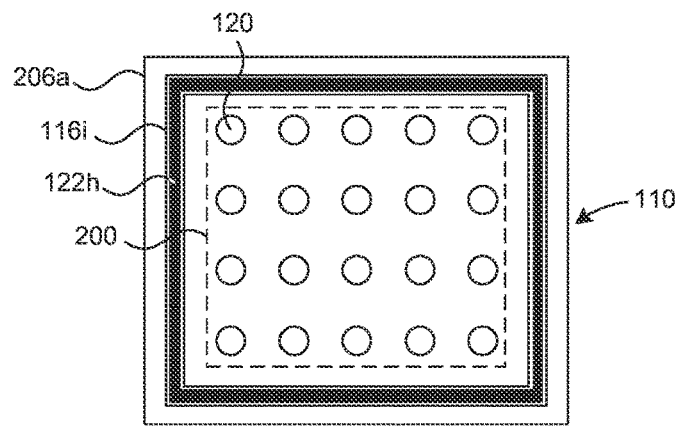
FIGS. 3A-3E are top-down views of elongated structural elements mounted to the bottom surface of the substrate in accordance with the present technology.

FIG. 3A shows an elongated structural element 122h that is located between the perimeter 200 and the outer edge 206 of the substrate 110. The structural element 122h can be mounted to a continuous copper pad that forms the structural element bond pad 116i that extends laterally around the perimeter of the package substrate 110. The structural element 122h can be formed of a sheet or one piece of material. In other embodiments, the structural element 122h can be formed of multiple pieces of material that are positioned proximate each other and/or interconnected or fused together.

Figure 3B:
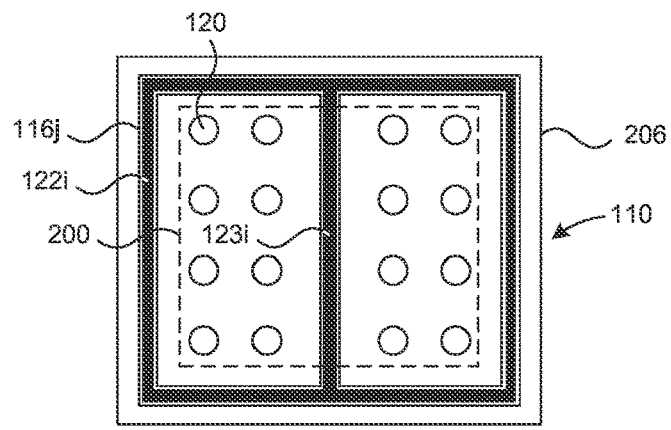

FIG. 3B shows an elongated structural element 122i that is mounted to a corresponding structural element bond pad 116j located between the perimeter 200 of the BGA and the outer edges 206 of the substrate 110. The structural element 122i also has an inner portion 123i that extends through the BGA and/or between solder balls 120. The inner portion 123i is indicated separately for clarity, however it should be understood that the structural element 122i and the inner portion 123i can be formed of a single piece of material or can be formed of multiple pieces of material as discussed previously with FIG. 3A. The inner portion 123i can bisect the BGA as shown, or can be positioned closer to one of the outer edges 206 of the substrate 110. In other embodiments, the inner portion 123i can extend partially through the BGA.

Figure 3C:
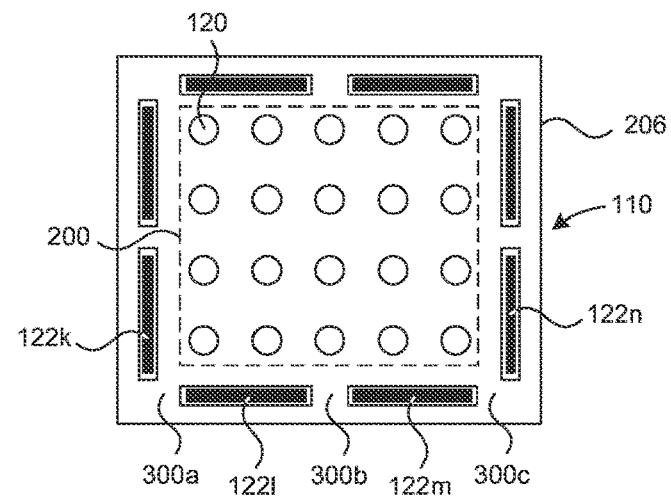

FIG. 3C shows a plurality of structural elements 122 that are located between the perimeter 200 of the BGA and the outer edges 206 of the substrate 110. Gaps 300a, b, c between adjacent structural elements 122k, l, m, n can allow room for signal routing, while still providing extra structural protection along the outer edges 206. Not all of the gaps 300 and structural elements 122 are indicated separately. In some embodiments, more or fewer structural elements 122 can be used, and different sizes and shapes of structural elements 122, and well as different sizes and locations of the gaps 300 are contemplated.

Figure 3D:
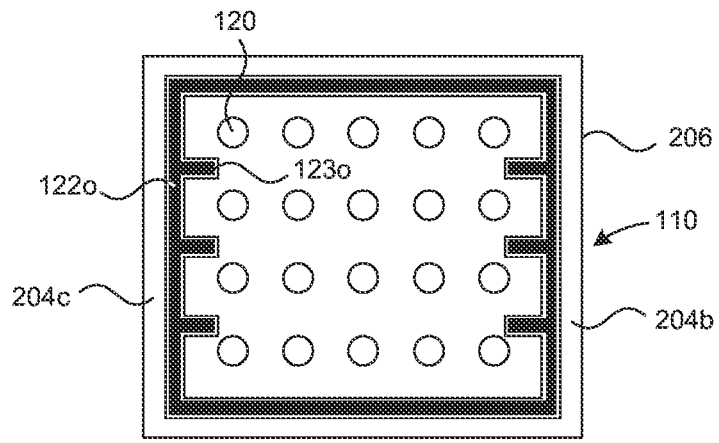
Figure 3E:
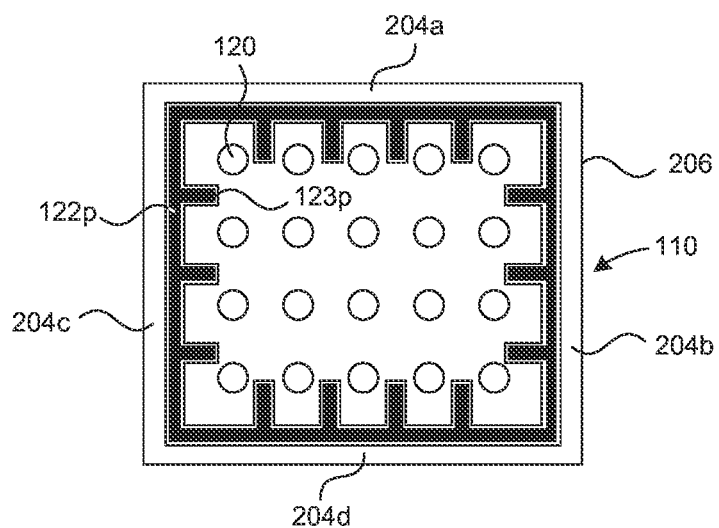

FIGS. 3D and 3E show non-uniform structural elements 122 that are located along the outer edge 206 of the substrate 110, and have a plurality of inner portions 123 that extend toward the BGA. One or more of the inner portions 123 may extend partially or fully between one or more of the solder balls 120 in the ball grid array. In FIG. 3D, inner portions 123o (only one is indicated) extend toward the BGA from two opposite sides 204b, c of the structural element 122o, while in FIG. 3E, the inner portions 123p (only one is indicated) extend toward the BGA from four sides 204a-d of the structural element 122p. The number of inner portions 123p can vary, and the inner portions 123p can extend from one side 204 or three sides 204.

In some embodiments, different configurations can be used, such as incorporating gaps 300, as shown in FIG. 3C, in the structural elements 122 of FIGS. 3D and 3E. Also, one or more discreet structural elements 122 can be positioned between solder balls 120 of the BGA, as discussed above in FIGS. 2A-2C, and incorporated into any of the other configurations.

Referring again to FIGS. 3A, 3B, 3D, and 3E, signal routing, if needed, can be accomplished through one or more openings in the solder mask (not shown).

Although the FIGS. 2A-3C are described with respect to the substrate 110, it should be understood that the solder balls 120 of the BGA and the structural elements 122 could instead be interconnected to the PCB 104 before interconnecting the features with the substrate 110.

FIGS. 4A-4H illustrate cross-sectional views of an assembly process using one or more of the structural elements 122 of FIGS. 2 and 3 in accordance with the present technology. FIG. 5 is a flow chart of a method 500 for assembling and/or manufacturing the semiconductor device 102 and the PCB 104 and incorporating one or more of the structural elements 122 in accordance with the present technology. FIG. 5 will be discussed with reference to FIGS. 4A-4H.

Figure 4A:
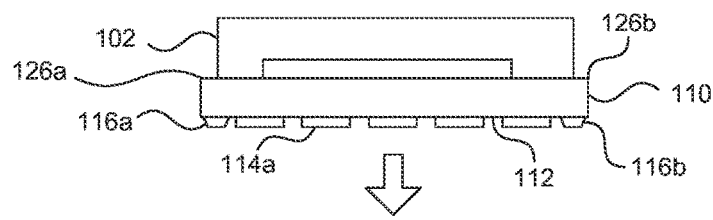
FIGS. 4A-4H show cross-sectional views of an assembly process using one or more of the structural elements of FIGS. 2A-2C and 3A-3E in accordance with the present technology.

As shown in FIG. 4A, the method 500 includes mounting, depositing, or otherwise adhering an array of BGA bond pads 114a that correspond to the solder balls 120 of the BGA, and one or more structural element bond pad 116a, b that corresponds to the structural element(s) 122, on the mounting surface 112 of the substrate 110 (block 502). The array of BGA bond pads 114a and structural element bond pads 116 can be made of a metal such as copper, but are not so limited. The geometric shape(s) of the structural element bond pads 116 reflect(s) the geometry of the associated structural element 122. Although FIGS. 4A-4H show a configuration wherein two cylindrical structural elements 122 are located proximate two corners 126 of the substrate 110, the technology is not so limited and structural elements 122 can be any of the other discussed geometries or variations thereof.

Figure 4B:
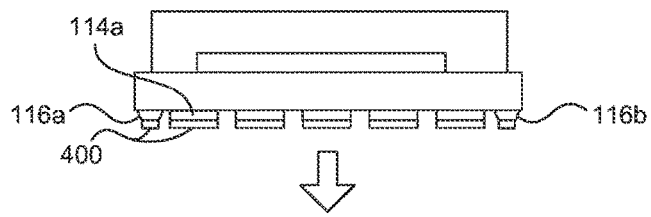
Figure 5:
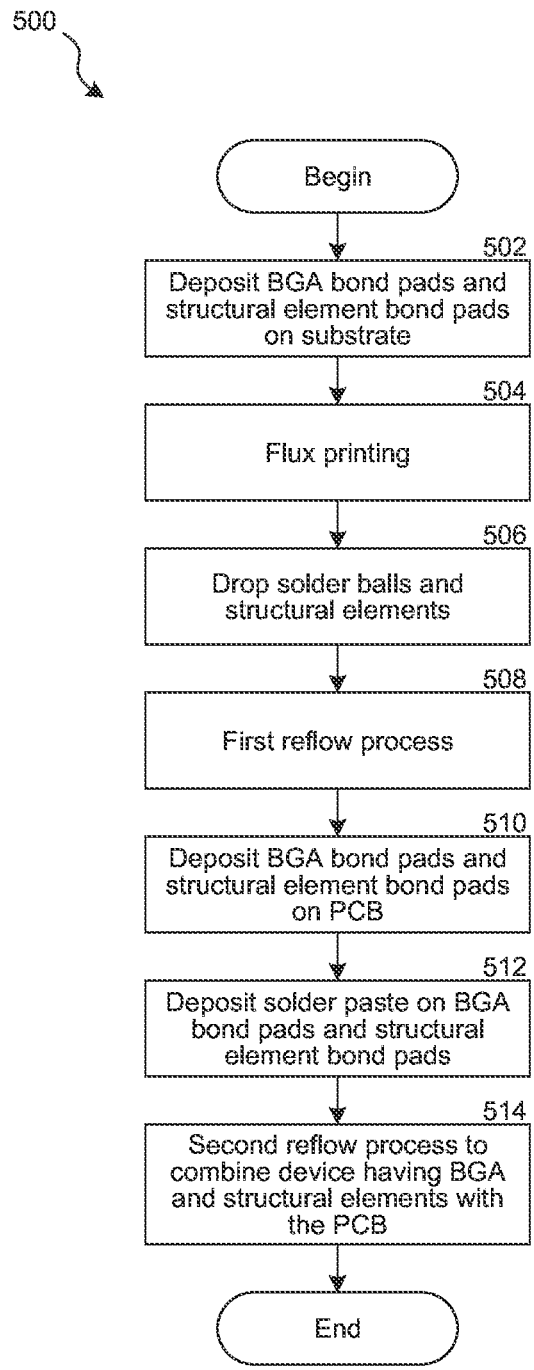
FIG. 5 is a flow chart of a method for assembling a semiconductor device and a printed circuit board incorporating one or more of the structural elements in accordance with the present technology.

Flux printing can be accomplished to deposit solder flux 400 or other desired material across the surfaces of the array of BGA bond pads 114a and the structural element bond pads 116 (block 504), as shown in FIG. 4B. In some methods, flux printing may be optional.

Figure 4C:
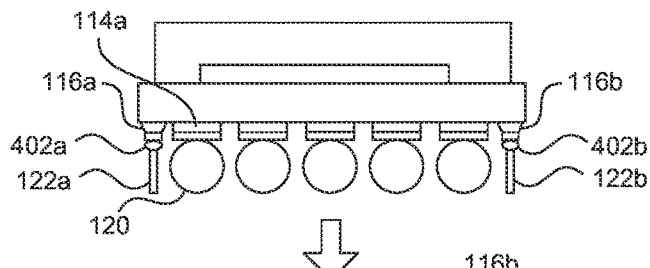

The solder balls 120 can be dropped on the array of BGA bond pads 114a and the structural element(s) 122 can be dropped on the associated structural element bond pads 114 (block 506), as shown in FIG. 4C. In some cases, the structural elements 122 can be pre-soldered or include a deposit of solder 402. For example, the structural elements 122 can include a collar of solder or a solder float. In other embodiments, solder 402 can be deposited on the structural element bond pads 116 before dropping the structural elements 122. Accordingly, the structural elements 122 can be built up from the substrate 110 and integrated into standard processes of combining the semiconductor device 102 with the PCB 104.

A first reflow process is accomplished (block 508 and FIG. 4D) to mechanically and/or electrically secure the solder balls 120 to the array of BGA bond pads 114a and the structural elements 122 to the structural element bond pads 116. Accordingly, the first solder joint 124a, b is formed between the structural element 122 and its corresponding structural element bond pad 116 on the substrate 110.

Figure 4D:
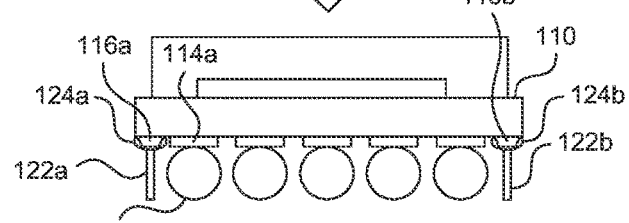
Figure 4E:
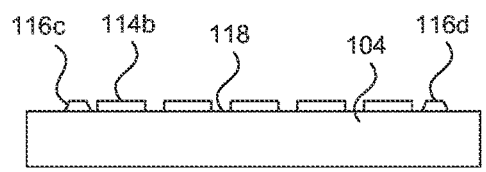

Turning to FIG. 4E, the array of BGA bond pads 114b and the structural element bond pads 116c, d are deposited on the mounting surface 118 of the PCB 104 (block 510). The array of BGA bond pads 114b on the mounting surface 118 of the PCB 104 is in alignment with the array of BGA bond pads 114a on the mounting surface 112 of the substrate 110, and the structural element bond pads 116c, d on the mounting surface 118 of the PCB 104 are in alignment with the structural element bond pads 116a, b on the mounting surface 112 of the substrate 110. As discussed above, the geometry of the structural element bond pads 116 can reflect the geometry of the associated structural element 122.

Figure 4G:
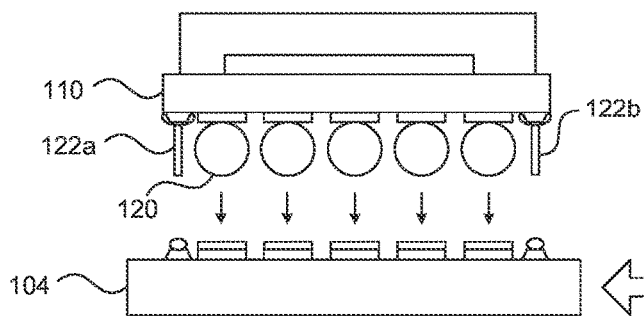
Figure 4F:
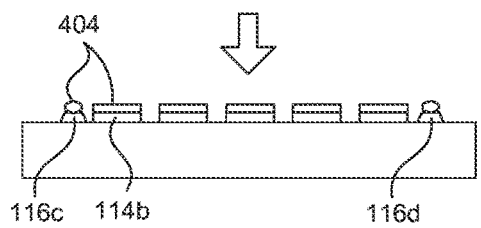

Solder paste 404 can be deposited on the array of BGA bond pads 114 and structural element bond pads 116, as shown in FIG. 4F (block 512). In some cases, solder paste 404 may not be deposited if the corresponding structural element 122 is pre-soldered.

Figure 4H:
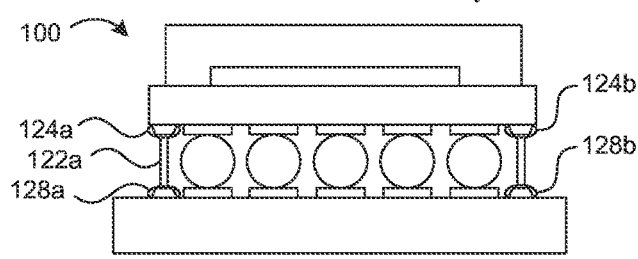

The assembly including the substrate 110 shown in FIG. 4D and the assembly including the PCB 104 shown in FIG. 4F can be combined in a second reflow process as shown in FIG. 4G (block 514). FIG. 4H shows the assembled semiconductor package 100 with the solder joints 124a, b and solder joints 128a, b that are formed between the structural elements 122 and their corresponding structural element bond pads 116.

In some embodiments, as shown and discussed with reference to FIGS. 1 and 4, the height or thickness of the BGA bond pads 114a, b and the height or thickness of the structural element bond pads 116a-d can be the same. In other embodiments, the heights can be different, as long as a uniform distance between the mounting surface 112 of the substrate 110 and the mounting surface 118 of the PCB 104 is maintained.

Figure 6:
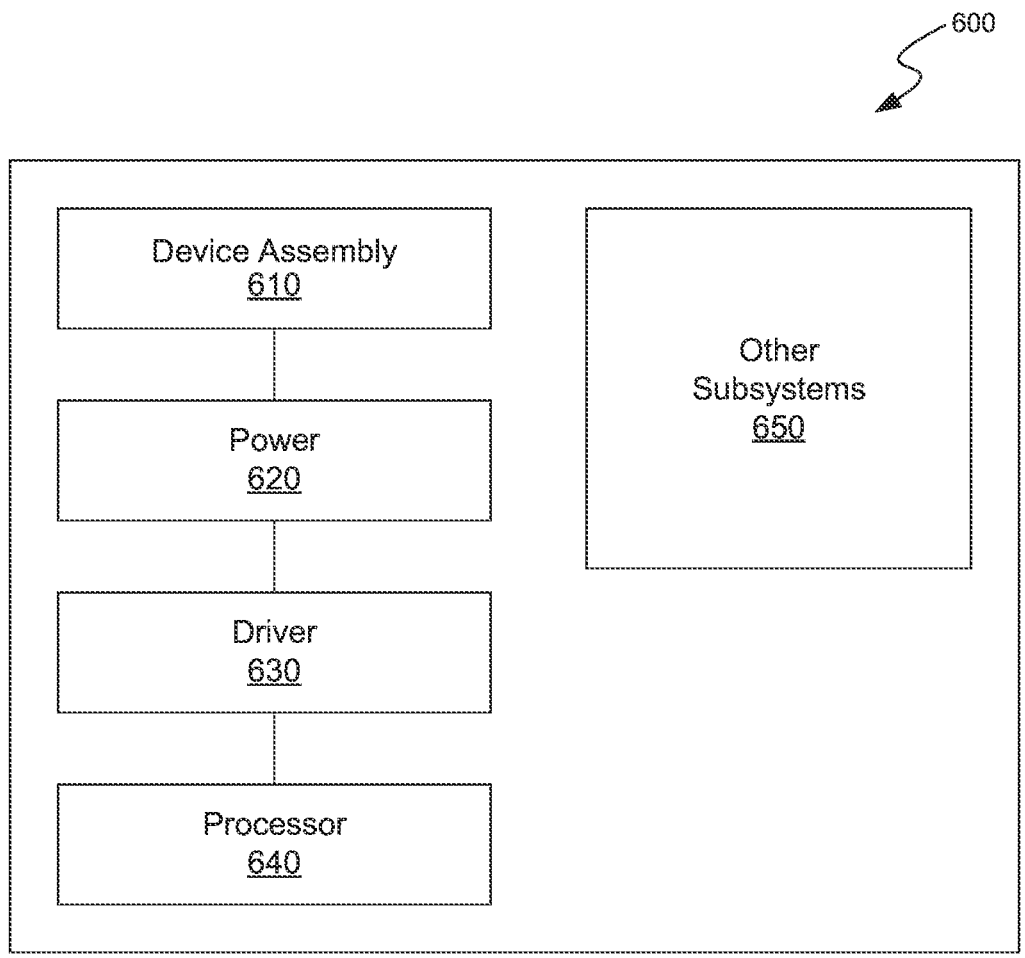
FIG. 6 is a schematic view showing a system that includes a semiconductor device assembly configured in accordance with an embodiment of the present technology.

Any one of the semiconductor devices, assemblies, and/or packages described above with reference to FIGS. 1 through 5 can be incorporated into any of a myriad of larger and/or more complex systems, a representative example of which is system 600 shown schematically in FIG. 6. The system 600 can include a semiconductor device assembly 610, a power source 620, a driver 630, a processor 640, and/or other subsystems or components 650. The semiconductor device assembly 610 can include features generally similar to those of the semiconductor device assemblies described above. The resulting system 600 can perform any of a wide variety of functions such as memory storage, data processing, and/or other suitable functions. Accordingly, representative systems 600 can include, without limitation, hand-held devices (e.g., mobile phones, tablets, digital readers, and digital audio players), computers, vehicle and other machines and appliances. Components of the system 600 may be housed in a single unit or distributed over multiple, interconnected units (e.g., through a communications network). The components of the system 600 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

We claim:

1. A semiconductor package assembly, comprising:
   a first mounting surface of a package substrate facing a second mounting surface of a printed circuit board;
   a first structural element bond pad mounted to the first mounting surface;
   a second structural element bond pad mounted to the second mounting surface, the first and second structural element bond pads aligned with each other; and
   a structural element interconnected with a first solder joint to the first structural element bond pad and interconnected with a second solder joint to the second structural element bond pad; and
   an additional structural element interconnected with a third solder joint to the first structural element bond pad and interconnected with a fourth solder joint to the second structural element bond pad, wherein the structural element and the additional structural element extend between the first and second structural element bond pads to absorb mechanical shock when a compressive force pushes one of the first and second mounting surfaces toward the other.

2. The semiconductor package assembly of claim 1, wherein the first structural element bond pad is located proximate a first corner of the first mounting surface and the second structural element bond pad is located proximate a corresponding corner of the second mounting surface.

3. The semiconductor package assembly of claim 2, further comprising an array of ball grid array (BGA) bond pads mounted to the first mounting surface for accepting solder balls, wherein the first structural element bond pad is located between a perimeter of the array of BGA bond pads and an outer edge of the first mounting surface.

4. The semiconductor package assembly of claim 1, further comprising an array of BGA bond pads mounted to the first mounting surface for accepting solder balls, wherein at least one of the bond pads in the array of BGA bond pads is located closer to an outer edge of the first mounting surface than the first structural element bond pad.

5. The semiconductor package assembly of claim 1, wherein the structural element and the additional structural element are metal.

6. The semiconductor package assembly of claim 1, wherein the structural element and the additional structural element include at least one of copper and aluminum.

7. The semiconductor package assembly of claim 1, wherein the first and second structural element bond pads are electrically isolated.

8. The semiconductor package assembly of claim 1, wherein the structural element is a copper wire.

9. The semiconductor package assembly of claim 1, wherein the structural element has a non-uniform shape, and wherein a shape of the first and second structural element bond pads reflects the non-uniform shape.

10. The semiconductor package assembly of claim 1, wherein the structural element has a non-uniform shape that extends laterally proximate a first side of the first mounting surface.

11. The semiconductor package assembly of claim 1, wherein:
   the structural element and the additional structural element comprise first and second structural elements; and
   the semiconductor package assembly further comprises a third structural element interconnected between the first and second structural element bond pads.

12. A semiconductor package assembly, comprising:
   a first mounting surface of a package substrate facing a second mounting surface of a printed circuit board;
   a first array of bond pads mounted to the first mounting surface for accepting solder balls of a ball grid array (BGA);
   a second array of bond pads mounted to the second mounting surface for accepting the solder balls of the BGA, the second array of bond pads aligned with the first array of bond pads;
   one or more first and second structural element bond pads mounted to the first mounting surface, the first and second structural element bond pads located in first and second corners of the first mounting surface between the first array of bond pads and an outer edge of the first mounting surface;

one or more third and fourth structural element bond pads mounted to the second mounting surface, the third and fourth structural element bond pads aligned with the first and second structural element bond pads, respectively;

a first structural element interconnected with a pair of a respective one of each of the first and third structural element bond pads;

a second structural element interconnected with the pair of the respective one of each of the first and third structural element bond pads at a different location from the first structural element; and a third structural element interconnected with a pair of a respective one of each of the second and fourth structural element bond pads.

13. The semiconductor package assembly of claim 12, further comprising:

one or more fifth and sixth structural element bond pads mounted to the first mounting surface, the fifth and the sixth structural element bond pads located in third and fourth corners of the first mounting surface between the first array of bond pads and the outer edge of the first mounting surface;

one or more seventh and eighth structural element bond pads mounted to the second mounting surface, the seventh and the eighth structural element bond pads aligned with the fifth and sixth structural element bond pads, respectively; and a fourth structural element interconnected with a pair of a respective one of each of the fifth and the seventh structural element bond pads; and a fifth structural element interconnected with a pair of a respective one of each of the sixth and the eighth structural element bond pads.

14. The semiconductor package assembly of claim 12, wherein the first, second, and third structural elements are metal.

* * * * *